United States Patent
Katscher et al.

(10) Patent No.: US 10,852,381 B2
(45) Date of Patent: Dec. 1, 2020

(54) SUSCEPTIBILITY MAPPING OF A MOVING OBJECT

(71) Applicant: KONINKLIJKE PHILIPS N.V., Eindhoven (NL)

(72) Inventors: Ulrich Katscher, Hamburg (DE); Jan Jakob Meineke, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 139 days.

(21) Appl. No.: 16/082,983

(22) PCT Filed: Mar. 14, 2017

(86) PCT No.: PCT/EP2017/055884
§ 371 (c)(1),
(2) Date: Sep. 7, 2018

(87) PCT Pub. No.: WO2017/157872
PCT Pub. Date: Sep. 21, 2017

(65) Prior Publication Data
US 2019/0033411 A1    Jan. 31, 2019

(30) Foreign Application Priority Data
Mar. 14, 2016    (EP) .................................... 16160198

(51) Int. Cl.
*G06K 9/00*    (2006.01)
*G01R 33/563*    (2006.01)
(Continued)

(52) U.S. Cl.
CPC .......... *G01R 33/563* (2013.01); *G01R 33/443* (2013.01); *G06T 7/20* (2013.01);
(Continued)

(58) Field of Classification Search
CPC .. G01R 33/243; G01R 33/443; G01R 33/563; G01R 33/56509; G01R 33/56536;
(Continued)

(56) References Cited

U.S. PATENT DOCUMENTS

| 2002/0130660 A1 | 9/2002 | Thesen |
| 2008/0253639 A1 | 10/2008 | Van Den Brink |

(Continued)

FOREIGN PATENT DOCUMENTS

WO    2014154544 A1    10/2014

OTHER PUBLICATIONS

Jiang et al "Diffusion Tensor Imaging (DTI) of the Brain in Moving Subjects: Application to In-Utero Fetal and Ex-Utero Studies" Magneic Resonance in Med. 62: p. 645-655 (2009).
(Continued)

*Primary Examiner* — Xin Jia

(57) ABSTRACT

The invention relates to a magnetic resonance imaging system (10), the system comprising a magnetic resonance imaging device (12) for acquiring data from a moving subject (14), especially a fetus or a part of said fetus; and an image generator (30) for generating an image of said moving subject (14), wherein the magnetic resonance imaging device (12) is configured to acquire the data from the subject (14) at different positions of said subject (14) with respect to a magnetization direction $B_0$, utilizing the movement of the subject (14); and wherein the image generator (30) is configured to —determine the position and/or orientation of said subject (14) during the respective data acquisition; —reconstruct phase images from the acquired data; and —generate a susceptibility map based on the reconstructed phase images. The invention further relates to a corresponding method for generating an image of the subject (14).

20 Claims, 2 Drawing Sheets

(51) Int. Cl.
G01R 33/44 (2006.01)
G06T 7/70 (2017.01)
G06T 7/20 (2017.01)
G06T 11/00 (2006.01)
G01R 33/565 (2006.01)
G01R 33/24 (2006.01)

(52) U.S. Cl.
CPC ............. *G06T 7/70* (2017.01); *G06T 11/006* (2013.01); *G01R 33/243* (2013.01); *G01R 33/56509* (2013.01); *G01R 33/56536* (2013.01); *G06T 2207/10088* (2013.01)

(58) Field of Classification Search
CPC ......... G06T 11/006; G06T 2207/10088; G06T 7/20; G06T 7/70
See application file for complete search history.

(56) References Cited

U.S. PATENT DOCUMENTS

| | | | | |
|---|---|---|---|---|
| 2011/0044524 | A1* | 2/2011 | Wang | G01R 33/54 382/131 |
| 2011/0243386 | A1* | 10/2011 | Sofka | G06K 9/6278 382/103 |
| 2012/0321162 | A1 | 12/2012 | Liu et al. | |
| 2014/0103929 | A1* | 4/2014 | Liu | G01R 33/443 324/309 |
| 2014/0162894 | A1* | 6/2014 | Hatchwell | C12Q 1/6883 506/9 |
| 2016/0133042 | A1* | 5/2016 | Kim | G06K 9/52 345/424 |

OTHER PUBLICATIONS

Liu et al Calculation of Susceptibility Through Multiple Orientation Samping (COSMOS) . . Magn. Reson. Med. 2009, Jan. 2009, (1) p. 196-204.
Bilgic Berkin et al: "Sparse methods for Quantitative Susceptibility Mapping", Optomechatronic Micro/Nano Devices and Components III : Oct. 8-10, 2007, Lausanne, Switzerland; [Proceedings of SPIE , ISSN 0277-786X], SPIE, Bellingham, Wash, vol. 9597,Sep. 11, 2015 (Sep. 11, 2015), pp. 959711-959711.
Bilgic Berkin et al: "Rapid multi-orientation quantitative susceptibility mapping", NeuroImage, vol. 125, Aug. 12, 2015 (Aug. 12, 2015), pp. 1131-1141.
Wei Li et al: "Quantitative susceptibility mapping of human brain reflects spatial variation in tissue composition", Veuroimage, Academic Press, Orlando, FL, US, vol. 55, No. 4,Nov. 24, 2010 (Nov. 24, 2010), pp. 1645-1656.
Jaladhar Neelavalli et al: "Measuring venous blood oxygenation in fetal brain using susceptibility-weighted imaging", Journal of Magnetic Resonance Imaging, vol. 39, No. 4, Nov. 4, 2013 (Nov. 4, 2013), pp. 998-1006.
Vasylechko et al "T2* Relaxometry of Fetal Brain at 1.5 Tesla Using a Motion Tolerant Method" Magnetic Resonance in Medicine 73:1795-1802 (2015).
Wang et al "Quantitative Susceptibility Mapping (QSM): Decoding MRI Data for a Tissue Magnetic Biomarker" Magnetic Resonance in Medicine 73:82-101 (2015).
Studholme "Mapping Fetal Brain Development in utero Using MRI: The Big Bang of Brain Mapping" Annu Rev Biomed Eng. Aug. 15, 2011; 13: 345-368. doi:10.1146/annurev-bioeng-071910-124654.
Glenn et al "Magnetic Resonance Imaging of the Fetal Brain and Spine: An Increasingly Important Tool in Prenatal Diagnosis, Part 1" Am. J. Neuroradiology 27, Sep. 2006, p. 1604-1611.

* cited by examiner

SUSCEPTIBILITY MAPPING OF A MOVING OBJECT

CROSS REFERENCE TO RELATED APPLICATIONS

This application is a U.S. national phase application of International Application No. PCT/EP2017/055884, filed on Mar. 14, 2017, which claims the benefit of EP Application Serial No. 16160198.4 filed on Mar. 14, 2016 and is incorporated herein by reference.

FIELD OF THE INVENTION

The invention relates to a magnetic resonance imaging system, the system comprising a magnetic resonance imaging device for acquiring data from a subject and an image generator for generating an image of the subject. The invention further relates to a corresponding method for generating an image of the subject.

BACKGROUND OF THE INVENTION

Quantitative Susceptibility Mapping (QSM) provides a novel contrast mechanism in Magnetic Resonance Imaging (MRI) different from traditional Susceptibility Weighted Imaging. Thus, Quantitative Susceptibility Mapping (QSM) is already known as a promising technique to investigate brain structure, particularly brain iron and myelin. The voxel intensity in QSM is linearly proportional to the underlying tissue apparent magnetic susceptibility $\chi$. The magnetic susceptibility $\chi$ can be mapped to the observed phase shift in MRI via a well-understood transformation, yet the inverse problem, namely the estimation of $\chi$ from phase, is ill-posed due to zeros on a conical surface in the Fourier space of the forward transform. Hence, $\chi$ inversion benefits from additional regularization, which is an approach that commonly involves introducing additional information in order to solve an ill-posed problem or to prevent over-fitting.

Document US 2012/0321162 A1 shows a magnetic resonance imaging system, the system comprising a magnetic resonance imaging device for acquiring data from a subject like brain structure of a human; and an image generator for generating an image of the subject applying QSM.

On the other hand, fetal imaging is an upcoming application of Magnetic Resonance Imaging (MRI) for improved diagnostic possibilities of unborn children in uterus in comparison with competing modalities. In this context, several MR contrasts have been successfully acquired, e.g., diffusion tensor imaging (DTI) or relaxometry. The scientific paper "S. Jiang et al.: Diffusion Tensor Imaging (DTI) of the Brain in Moving Subjects: Application to In-Utero Fetal and Ex-Utero Studies. Magnetic Resonance in Medicine 62:645-655 (2009)" discusses the use of diffusion tensor imaging for mapping fetal brain development in utero.

SUMMARY OF THE INVENTION

It is an object of the invention to provide an MRI system and corresponding MRI method suitable for generating an image of a moving subject.

This object is achieved by the features of the independent claims. The dependent claims detail advantageous embodiments of the invention.

According to various embodiments of the invention, the magnetic resonance imaging system comprises a magnetic resonance imaging device (MRI device) for acquiring data from a moving subject; and an image generator for generating an image of said moving subject, wherein the magnetic resonance imaging device is configured to acquire the data from the subject at different positions (or orientations) of said subject with respect to a magnetization direction $B_0$, utilizing the movement of the subject; and wherein the image generator is configured to (i) determine the position and/or orientation of said subject during the respective data acquisition; (ii) reconstruct phase images from the acquired data; and (iii) generate a (quantitative) susceptibility map based on the reconstructed phase images. In general, the image generator comprises a computing device including the usual components like a processor, a memory, and an application that is configured to execute on the processor. In many cases, the image generator is configured to generate an image of the moving subject based on the susceptibility map. In principle, any 3D gradient echo sequence can be used for data acquisition. In practice, high resolution imaging with a moderately long echo time is preferred to obtain sufficient susceptibility effects. The generated susceptibility map provides a three-dimensional susceptibility distribution of the subject. The magnetic resonance imaging system according to the embodiments of the invention uses the different positions of the subject to overcome the ill-posed nature of the inverse problem of QSM. The inverse problem of QSM is ill-posed within a certain region of the k-space, where the dipole reconstruction kernel is zero. To solve this problem, some (image-based) regularization approaches have been proposed. One approach is the "calculation of susceptibility using multiple orientation sampling" (COSMOS) method, e.g. described in 'T. Liu et al.: "Calculation of susceptibility through multiple orientation sampling (COSMOS): a method for conditioning the inverse problem from measured magnetic field map to susceptibility source image in MRI"; Magn Reson Med. 2009 January; 61(1): 196-204'. This approach is robust and accurate in quantitatively mapping susceptibility. The image generator is configured to realize one of these approaches. However, the ideal method to cope with the ill-posed nature of the inverse problem of QSM would be the repeated measurement with rotating the subject of interest with respect to $B_0$. For the avoidance of doubt, Calculation of susceptibility through multiple orientation sampling (COSMOS) should be intepreted as the utilization of different orientations of the subject with respect to the magnetization direction B0. Other aspects of the method as disclosed by Liu et al are not essential for performance of the method herein disclosed. For example the method as disclosed herein could be performed by means of a single echo acquisition. Multi-echo acquisition is not necessary.

Basics of the QSM technology as well as MRI contrast generation based on this technology are discussed in the above mentioned document US 2012/0321162 A1 (e.g. Fourier Relationship Between Phase and Magnetic Susceptibility, Susceptibility Mapping by k-Space Partitions, Adaptive Phase-Wrap Insensitive Background Removal, and Multi-Echo Interleaved Image Acquisition).

In general, a patient/person being the subject would be told to change position from scan to scan for COSMOS calculations, which causes a movement of said subject "influenced from the outside". In the present case the moving subject preferably is a subject moving uninfluenced from the outside (e.g. by itself). A subject performing more or less uninfluencable movements especially is a fetus or a part of said fetus, preferably the brain of said fetus. For (adult) patients the range of rotation with respect to $B_0$ is typically limited by the magnetic resonance imaging device. For fetal brain imaging, however, the natural motion of the fetus can be utilized to complete the missing data. The optimum phase of pregnancy for applying this aspect of the invention is a trade-off between the ability of the fetus to freely rotate in the uterus (i.e., earlier phase of gestation preferred) and maturity of the fetal brain (i.e., later phase of gestation preferred).

While motion can be utilized to overcome the ill-posed nature of the inverse problem of QSM, motion may have a negative impact on image quality if it takes place during image acquisition at a specific orientation of the subject. However, luckily many techniques are known in the field of MRI that have been developed to address this issue. Examples of such techniques are accelerating imaging until motion can be neglected and/or detecting motion in real-time and skipping affected k-space lines and/or detecting motion in real-time and performing some suitable grouping of k-space lines according to motion state.

Another example for movements more or less uninfluencable from the outside is given by the heart. Different rotational positions of (parts of) the heart muscle during the cardiac cycle can be utilized for QSM reconstruction described in this invention in analogy to fetal movements. During the cardiac cycle, the heart is changing shape. Therefore, according to embodiments of the invention, specific parts of the heart will be identified and mapped from different time points during the cardiac cycle. The generated susceptibility map comprise the specific identified part of parts of the heart.

According to one embodiment of the invention, the moving subject preferably is surrounded by liquid and/or solid material. The expected mean susceptibility of the subject is more similar to the expected mean susceptibility of said surrounding material than to the susceptibility of air.

According to a preferred embodiment of the invention, the image generator is configured to determine whether the subject is completely surrounded by liquid and/or solid material, especially human tissue, of a predetermined thickness.

According to another preferred embodiment of the invention, the image generator is configured to determine whether the susceptibility difference between the expected mean susceptibility of the subject and the expected mean susceptibility of the surrounding material is below a predetermined maximum susceptibility difference.

According to yet another preferred embodiment of the invention the image generator is configured to perform a background field removal in order to eliminate phase components not related to local susceptibility sources of the subject when reconstructing the phase images from the acquired data. Preferably, the background field removal is based on spherical harmonics.

According to yet another preferred embodiment of the invention the image generator is configured to use a navigator or another standard MR motion detection technique to determine the position and/or orientation of the moving subject. Standard MR motion detection methods like navigators can be applied to track the fetus' position and orientation.

Imaging can be performed, e.g., using fast single shot sequences that allow high resolution, artefact-free images of individual slices to be collected. Subsequently, stacks of single shot images can be realigned post acquisition to provide for each orientation a self-consistent volumetric representation of the brain through slice to volume reconstruction.

According to various embodiments of the invention, the method for generating an image of a moving subject comprises the following steps:

Step 1: using a magnetic resonance imaging device for acquiring data from the subject, wherein the data are acquired at different positions (orientations) of said subject with respect to a magnetization direction $B_0$, utilizing the movement of the subject;

Step 2: determining the position and/or orientation of said subject during the respective data acquisition;

Step 3: reconstructing phase images from the acquired data; and

Step 4: generating a susceptibility map based on the reconstructed phase images. The different positions and/or orientations of the subject are used to overcome the ill-posed nature of the inverse problem of QSM by performing an appropriate approach to overcome said ill-posed nature of the inverse problem using different positions and/or orientations of the subject (14).

In many cases, the method comprises a further step 5 of generating a concrete image of the moving subject (from a specific perspective) based on said susceptibility map.

According to a preferred embodiment of the invention, the determining step 2 further comprises a determination whether the subject is completely surrounded by liquid and/or solid material of a predetermined thickness.

According to another preferred embodiment of the invention, the determining step 2 further comprises a determination whether the susceptibility difference between the expected mean susceptibility of the subject and the expected mean susceptibility of the surrounding material is below a predetermined maximum susceptibility difference.

According to yet another preferred embodiment of the invention the reconstructing step 3 of the method includes background field removal in order to eliminate phase components not related to local susceptibility sources of the subject. Preferably, the background field removal is based on spherical harmonics.

According to another preferred embodiment of the invention the effort of the background field removal step is reduced or the background field removal is skipped in case the image generator determined that the subject is completely surrounded by liquid and/or solid material of a predetermined thickness.

A critical step in standard QSM reconstruction is the elimination of undesired phase components, i.e., phase components unrelated to diagnostically relevant origins. The major undesired phase component arises from the air/tissue boundary. The distance to this air/tissue boundary is much larger for the fetal than the adult brain. The amniotic liquor surrounding the fetal head yields only a minor susceptibility discontinuity, thus diminishing the undesired phase component, relaxing the problem of background field removal. In optimal cases (optimal fetal positions), the background field removal can be skipped completely. In other cases (suboptimal fetal positions), the fetal brain might be too close to the outside air or to the mother's lungs to neglect the background field. However, in these cases, a background field removal based on spherical harmonics can be sufficient, which is more stable and faster than traditional methods for background field removal like SHARP (Sophisticated Harmonic Artifact Reduction on Phase data) or PDF (Projection onto Dipole Fields).

According to yet another preferred embodiment of the invention a navigator or another standard MR motion detection technique is used to determine the position and/or orientation of the moving subject.

The invention further relates to a computer program product for executing the aforementioned method on a computing device of a magnetic resonance imaging system.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
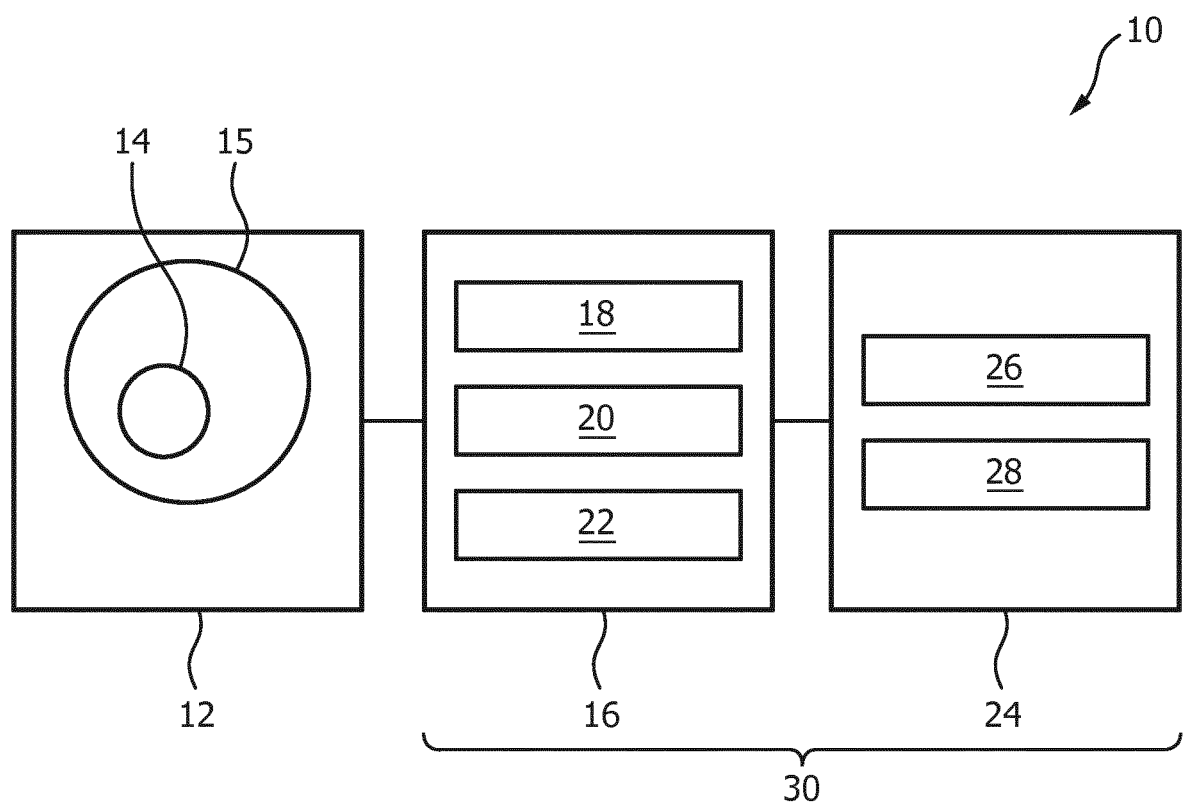
FIG. 1 shows a schematic representation of a MRI system.

FIG. 1 shows a block diagram of a magnetic resonance imaging (MRI) system 10 in accordance with embodiments of the present invention. Referring to FIG. 1, the system 10 includes an MRI device 12. The MRI device 12 may be configured for scanning and capturing an image of a moving subject 14 completely surrounded by liquid and/or solid material 15. Example subjects to be imaged include, but are not limited to, brain tissue, kidney tissue, liver tissue, heart tissue, and any other bodily tissues of a fetus. The MRI system 10 further includes a computing device 16. This computing device 16 may include a processor 18, a memory 20, and an object interacting application 22 that is configured to execute on the processor 18. The shown MRI system 10 further include a user-interface 24, such as an image generator, that is configured to display images on a display 26 and to receive user input through a user input device, such as, for example, a keyboard 28. Computing device 16 and user-interface 24 together form an image generator 30 of the system 10.

Figure 2:
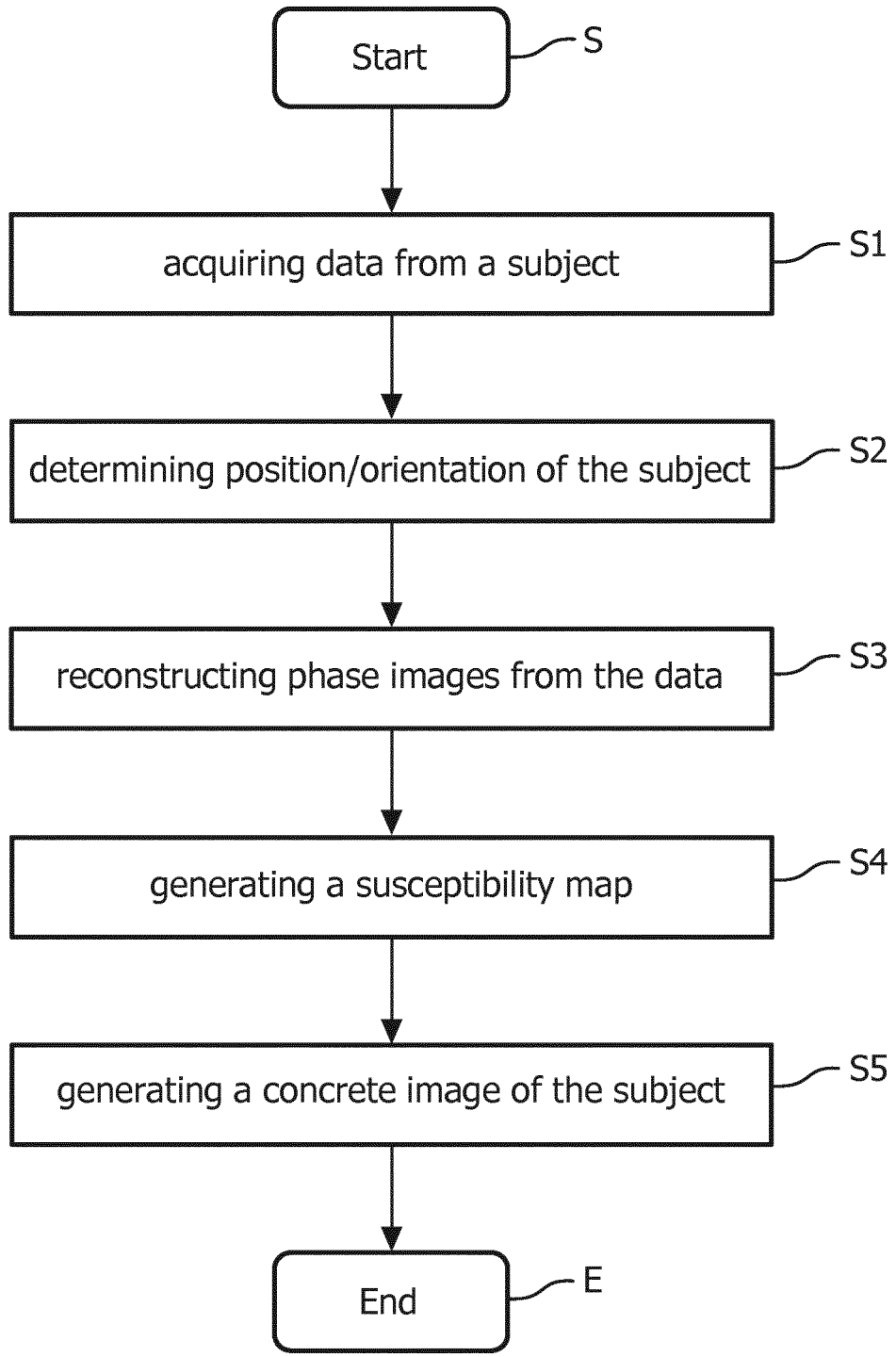
FIG. 2 shows a flow chart of a corresponding procedure for magnetic resonance imaging of a subject.

FIG. 2 shows a flow chart of a corresponding procedure for magnetic resonance imaging of the moving subject 14. The procedure starts at the starting point S, undergoes five process steps (S1-S5) and ends at the end point E.

At step S1 the magnetic resonance imaging device 12 is used for acquiring data from the subject 14, which preferably is a fetal brain of a fetal in uterus. The data are acquired at different positions (orientations) of said subject 14 with respect to a magnetization direction $B_0$ of a magnetic field generated by the MRI device 12. The movement between at least some of the positions is caused by the movement of the subject 14 itself, This movement might be uninfluenced from the outside.

At step S2, the position and/or orientation of said subject 14 during the respective data acquisition is determined by use of a navigator or another standard MR motion detection technique. In addition at step S2 it is determined whether the subject 14 is completely surrounded by liquid and/or solid material 15, namely human tissue, of a predetermined thickness. Furthermore, it is determined whether the expected mean susceptibility of this surrounding tissue has a difference to the expected mean susceptibility of the target organ, which is below a predetermined maximum susceptibility difference (e.g., difference of mean expected susceptibility between fetal brain and amniotic liquor is below the predetermined maximum susceptibility difference, but difference of mean expected susceptibility between fetal brain and maternal lung tissue is above the predetermined maximum susceptibility difference).

At step S3 the phase images from the acquired data are reconstructed; the reconstructing step S3 can include background field removal in order to eliminate phase components not related to local susceptibility sources of the subject; in particular the effort of the background field removal is reduced or the background field removal is even skipped in case the image generator 30 determines that the subject 14 is completely surrounded by material of a predetermined thickness.

At step S4 a susceptibility map based on the reconstructed phase images is generated; and At step S5 an image of the moving subject 14 based on the susceptibility map is generated. The different positions and/or orientations of the subject are used to overcome the ill-posed nature of the inverse problem of QSM by performing a calculation according to the COSMOS-approach.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A magnetic resonance imaging system, the system comprising: a magnetic resonance imaging device for acquiring data from a moving subject, wherein the subject is moving by itself, especially a fetus or a part of said fetus; and an image generator for generating an image of said moving subject, wherein the magnetic resonance imaging device is configured to acquire the data from the subject at different orientations of said subject with respect to a magnetization direction $B_0$, utilizing a natural movement of the subject;

and wherein the image generator is configured to determine the position and/or orientation of said subject during the respective data acquisition and utilize the natural motion of the subject to complete the missing data;

for the different orientations, reconstruct phase images from the acquired data; and generate a susceptibility map based on the reconstructed phase images;

using the determined positions and/or orientations of the subject to perform a calculation of susceptibility through multiple orientation sampling (COSMOS).

2. The system according to claim 1, wherein the image generator is configured to determine whether the subject is completely surrounded by liquid and/or solid material of a predetermined thickness.

3. The system according to claim 2, wherein the image generator is configured to determine whether the susceptibility difference between the expected mean susceptibility of the subject and the expected mean susceptibility of the surrounding material is below a predetermined maximum susceptibility difference.

4. The system according to claim 1, wherein the image generator is configured to perform background field removal in order to eliminate phase components not related to local susceptibility sources of the subject when reconstructing the phase images from the acquired data.

5. The system according to claim 4, wherein the image generator is configured to reduce the effort of the background field removal or to skip the background field removal in case the image generator determines that the subject is completely surrounded by material of the predetermined thickness.

6. The system according to claim 4, wherein the background field removal is based on spherical harmonics.

7. The system according to claim 1, wherein the image generator is configured to use a navigator or other standard magnetic resonance motion detection technique to determine the position and/or orientation of the moving subject.

8. A method for magnetic resonance imaging of a moving subject, wherein the subject is moving by itself, especially a fetus, the method comprising:
using a magnetic resonance imaging device for acquiring data from the subject, wherein the data are acquired at different positions of said subject with respect to a magnetization direction $B_0$, utilizing a natural movement of the subject (S1);
determining the position and/or orientation of said subject during the respective data acquisition and utilizing the natural motion of the subject to complete the missing data;
reconstructing phase images from the acquired data (S3); and
generating a susceptibility map based on the reconstructed phase images, wherein the determined positions and/or orientations of the subject are used to perform a calculation of susceptibility through multiple orientation sampling (COSMOS).

9. The method according to claim 8, wherein the determining step further comprises a determination whether the subject is completely surrounded by liquid and/or solid material of a predetermined thickness.

10. The method according to claim 8 wherein the determining step further comprises a determination whether the susceptibility difference between the expected mean susceptibility of the subject and the expected mean susceptibility of the surrounding material is below a predetermined maximum susceptibility difference.

11. The method according to claim 8, wherein the reconstruction step includes background field removal in order to eliminate phase components not related to local susceptibility sources of the subject.

12. The method according to claim 11, wherein the efford of the background field removal step is reduced or the background field removal is skipped in case the image generator determined that the subject is completely surrounded by liquid and/or solid material of a predetermined thickness.

13. The method according to claim 11, wherein the background field removal is based on spherical harmonics.

14. The method according to claim 8, wherein a navigator or another standard MR motion detection technique is used to determine the position and/or orientation of the moving subject.

15. A non-transitory computer-readable medium configured store instructions readable and executable by a computer to perform a method for magnetic resonance imaging of a moving subject, the method comprising:
using a magnetic resonance imaging device for acquiring data from the subject, wherein the data are acquired at different positions of said subject with respect to a magnetization direction $B0$, utilizing a natural movement of the subject;
determining the position and/or orientation of said subject during the respective data acquisition and utilizing the natural motion of the subject to complete the missing data;
reconstructing phase images from the acquired data; and
generating a susceptibility map based on the reconstructed phase images, wherein the determined positions and/or orientations of the subject are used to perform a calculation of susceptibility through multiple orientation sampling (COSMOS).

16. The non-transitory computer-readable medium according to claim 15, wherein the determining step further comprises a determination whether the subject is completely surrounded by liquid and/or solid material of a predetermined thickness.

17. The non-transitory computer-readable medium according to claim 15 wherein the determining step further comprises a determination whether the susceptibility difference between the expected mean susceptibility of the subject and the expected mean susceptibility of the surrounding material is below a predetermined maximum susceptibility difference.

18. The non-transitory computer-readable medium according to claim 15, wherein the reconstruction step includes background field removal in order to eliminate phase components not related to local susceptibility sources of the subject.

19. The non-transitory computer-readable medium according to claim 18, wherein the efford of the background field removal step is reduced or the background field removal is skipped in case the image generator determined that the subject is completely surrounded by liquid and/or solid material of a predetermined thickness.

20. The method according to claim 19, wherein the background field removal is based on spherical harmonics.

* * * * *